(12) United States Patent
Oh et al.

(10) Patent No.: US 7,956,979 B2
(45) Date of Patent: Jun. 7, 2011

(54) DISPLAY APPARATUS

(75) Inventors: Young-Rok Oh, Chunan-si (KR);
Jin-Ho Park, Suwon-si (KR);
Chae-Woo Chung, Chunan-si (KR);
Il-Goo Yoon, Asan-si (KR); Won-Seok Kim, Seoul (KR); Soo-Young Park, Daegu (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 119 days.

(21) Appl. No.: 12/193,487

(22) Filed: Aug. 18, 2008

(65) Prior Publication Data
US 2009/0122218 A1 May 14, 2009

(30) Foreign Application Priority Data
Nov. 9, 2007 (KR) .......................... 10-2007-0114281

(51) Int. Cl.
*G02F 1/1333* (2006.01)

(52) U.S. Cl. ....................................... 349/161; 362/373

(58) Field of Classification Search .................. 349/161; 362/632
See application file for complete search history.

(56) References Cited

U.S. PATENT DOCUMENTS

| | | | |
|---|---|---|---|
| 6,697,130 B2 * | 2/2004 | Weindorf et al. | 349/65 |
| 6,825,828 B2 * | 11/2004 | Burke et al. | 345/101 |
| 7,164,586 B2 * | 1/2007 | Lin | 361/714 |
| 7,438,450 B2 * | 10/2008 | Aoki et al. | 362/373 |
| 2006/0209228 A1 * | 9/2006 | Nishida | 349/59 |
| 2007/0211205 A1 * | 9/2007 | Shibata | 349/161 |
| 2010/0027296 A1 * | 2/2010 | Hamada | 362/632 |

* cited by examiner

*Primary Examiner* — Richard H Kim
(74) *Attorney, Agent, or Firm* — F. Chau & Associates, LLC

(57) ABSTRACT

A display apparatus includes a display module displaying an image using power and a control signal, the display module having a first surface including at least one power supply unit for supplying the power and a control board for supplying the control signal, and a heat radiation cover portion covering a part of the first surface of the display module including the power supply unit and the control board, wherein the heat radiation cover portion forms an air passage between the first surface of the display module and the heat radiation cover portion.

20 Claims, 10 Drawing Sheets

DISPLAY APPARATUS

CROSS-REFERENCE TO RELATED APPLICATION

This application claims priority to Korean Patent application No. 10-2007-0114281, filed on Nov. 9, 2007, the contents of which are herein incorporated by reference in their entirety.

BACKGROUND OF THE INVENTION

1. Technical Field

The present disclosure relates to a display apparatus, and more particularly, to a display apparatus having a heat radiation cover with a fan attached thereto.

2. Discussion of the Related Art

A liquid crystal display (LCD), which is a type of flat panel display, displays a desired image by controlling the light transmittance by changing the liquid crystal arrangement of unit pixels. Since the LCD is not a self light-emitting device, the LCD includes a backlight assembly placed behind a liquid crystal display panel to provide light to the liquid crystal display panel. The backlight assembly includes a light source, and a variety of elements for providing light of the light source to the display panel. The backlight assembly can employ a plurality of cold cathode fluorescent lamps (CCFL) as the light source.

A large number of lamps are mounted in the backlight assembly to improve the luminance of the display apparatus. For example, a display apparatus for outdoor advertisement such as a digital information display (DID) requires high luminance over 1,000 nits. To achieve such high luminance, the number of lamps mounted in a backlight assembly is increased and a tube current value input to the lamps is increased. However, when the number of the lamps and the tube current input to the lamps are increased, heat generated in the lamps is also increased. Optical sheets in the backlight assembly and a display panel are damaged due to the heat.

SUMMARY OF THE INVENTION

Exemplary embodiments of the present invention include a display apparatus having a heat radiation cover with a fan attached thereto to protect a plurality of control elements arranged on a rear surface of a lower receiving member and to cool the control elements and the rear surface of the lower receiving member.

Exemplary embodiments of the present invention provide a display apparatus, wherein a fan is provided behind the display apparatus to cool a lamp, and a heat radiation cover is installed to accommodate an inverter board, a control board and the fan behind the display apparatus, so that air behind the display apparatus flows smoothly using the fan and the heat radiation cover to thereby cool the lamp, the inverter board and the control board at the same time.

According to an exemplary embodiment of the present invention, a display apparatus includes a display module for displaying an image using power and a control signal, the display module having a rear surface formed with at least one power supply unit for supplying the power and a control board for supplying the control signal, and a heat radiation cover portion for covering a part of the rear surface of the display module including the power supply unit and the control board, and forming an air passage between the rear surface of the display module and the heat radiation cover portion.

The heat radiation cover portion may include a heat radiation cover spaced apart from the rear surface of the display module and defining the air passage, and at least one cooling fan mounted to the heat radiation cover for controlling air flow in the air passage.

The air passage may be defined throughout the rear surface of the display module and the distance between the heat radiation cover and the first surface is about 3 mm to about 12 mm.

The heat radiation cover portion may further include a plurality of protruding portions formed between the heat radiation cover and the rear surface of the display module.

A plurality of holes communicating with the air passage may be formed in the heat radiation cover.

The cooling fan may be electrically connected to the power supply unit of the display module through a power line, a portion of the power line may extend to the inside of the display module, and an end of the power line may extend to the inside of the air passage and be connected to the cooling fan.

The heat radiation cover may include a bottom surface for covering the rear surface of the display module, and a wall surface for covering at least a portion of a sidewall surface of the display module, the bottom surface and the wall surface being manufactured in a single body.

The bottom surface of the heat radiation cover may include a central portion corresponding to a central region of the rear surface of the display module, at least one power cover portion corresponding to the at least power supply unit mounted to the rear surface of the display module, and a control cover portion corresponding to the control board mounted to the rear surface of the display module, wherein the central portion, the power cover portion and the control cover portion are manufactured in a single body.

The bottom surface of the heat radiation cover may further include at least one fan mounting portion formed in a region adjacent to the power cover portion, wherein the at least one fan mounting portion is mounted with the at least one cooling fan.

The central portion may be manufactured in the shape of a plate, the fan mounting portion may include first and second fan mounting portions extending from both sides of the central portion and manufactured in a concave shape, and the power cover portion may include first and second plate-shape power cover portions respectively extending from the first and second fan mounting portions.

Inside bottoms of the first and second power cover portions may be positioned below an inside bottom of the central portion, and inside bottoms of the first and second fan mounting portions may be positioned below the inside bottoms of the first and second power cover portions.

The fan mounting portion may include at least one fan fixing hole corresponding to the cooling fan.

The fan mounting portion may include an air guide plate provided in a region adjacent to the fan fixing hole.

The cooling fan may be mounted to the central portion, or the power cover portion, or to the central portion and the power cover portion.

The power supply unit may include a power input connector, the control board may include a signal input connector, and the bottom surface of the heat radiation cover may further include a first terminal opening exposing the power input connector and a second terminal opening exposing the signal input connector.

A plurality of center holes may be formed in the central portion, and a user hole for fixing an A/D board may be formed in a region in which the center holes re formed.

The cooling fan may be electrically connected to the A/D board through a power line.

The power supply unit may include a power input connector, the control board may include a signal input connector, and the bottom surface of the heat radiation cover may further include a first terminal opening exposing the power input connector and a second terminal opening exposing the signal input connector, wherein the A/D board is electrically connected to the control board through the signal input connector in the second terminal opening.

The heat radiation cover may be fixed to the rear or a sidewall surface of the display module through a fixing member.

The display module may include a liquid crystal display panel, a backlight for supplying light to the liquid crystal display panel, and a receiving member for accommodating the liquid crystal display panel and the backlight.

BRIEF DESCRIPTION OF THE DRAWINGS

Exemplary embodiments of the present invention can be understood in more detail from the following description taken in conjunction with the accompanying drawings, in which.

DETAILED DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein.

Figure 1:
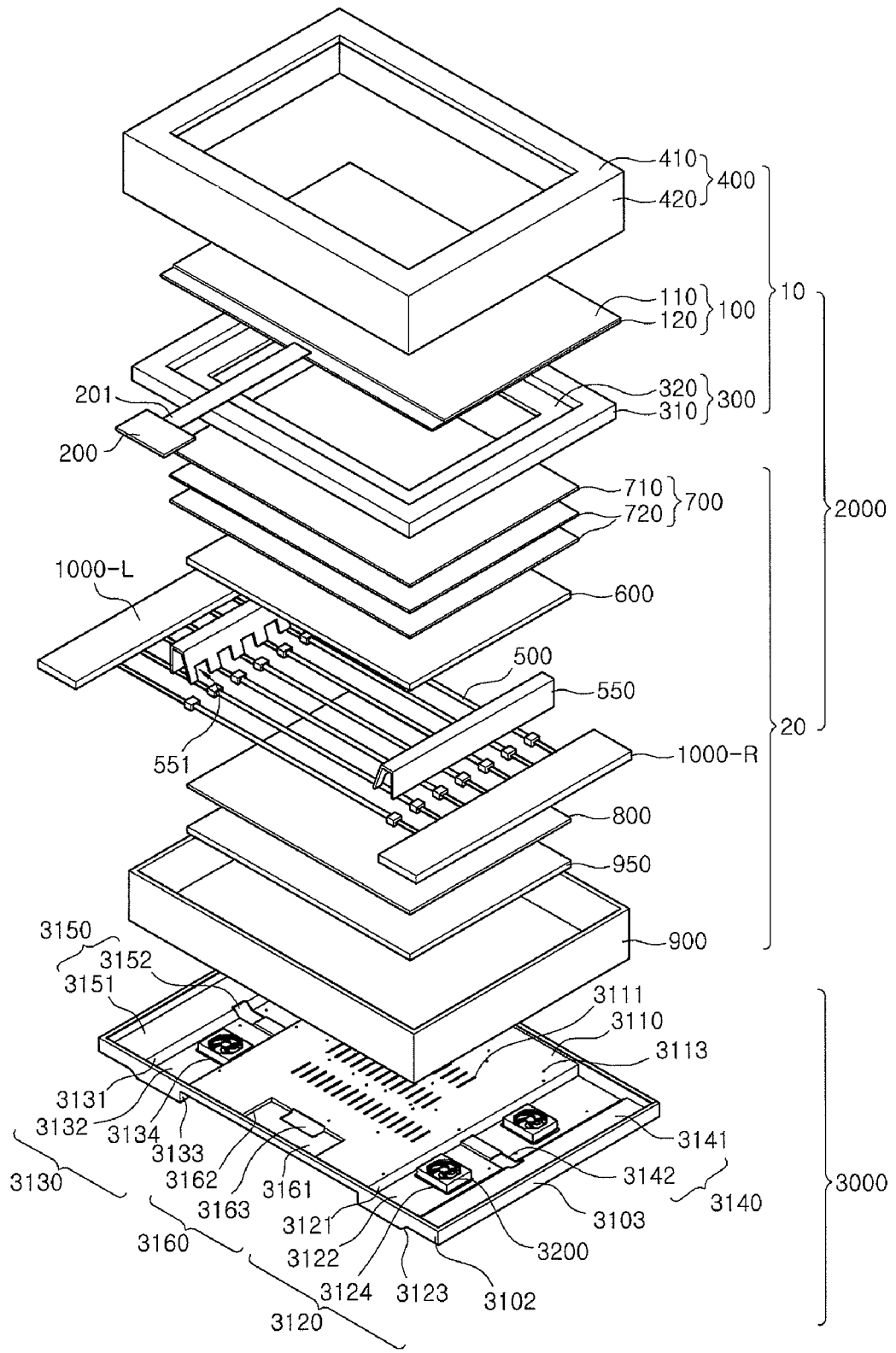
FIG. 1 is an exploded perspective view illustrating a display apparatus according to an exemplary embodiment of the present invention.
Figure 2:
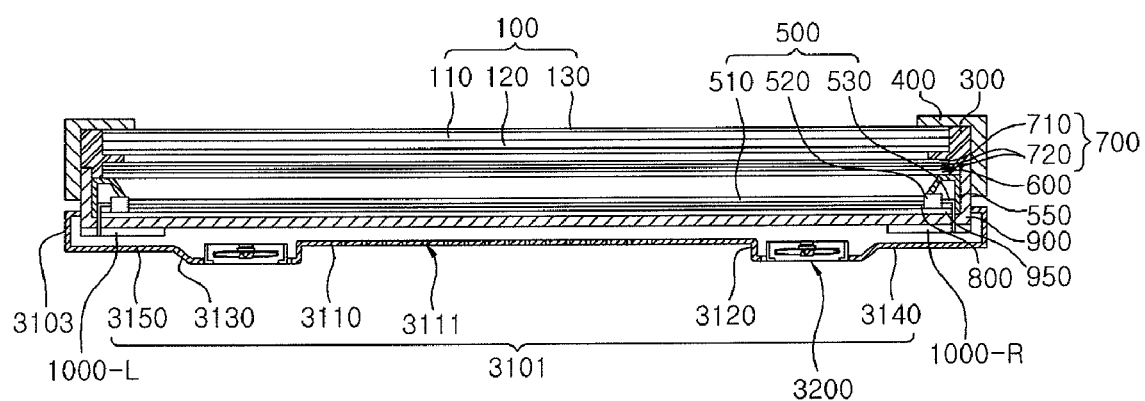
FIG. 2 is an assembled sectional view illustrating a display apparatus according to an exemplary embodiment of the present invention.

FIG. 1 is an exploded perspective view illustrating a display apparatus according to an exemplary embodiment of the present invention. FIG. 2 is an assembled sectional view illustrating a display apparatus according to an exemplary embodiment of the present invention.

Figure 3:
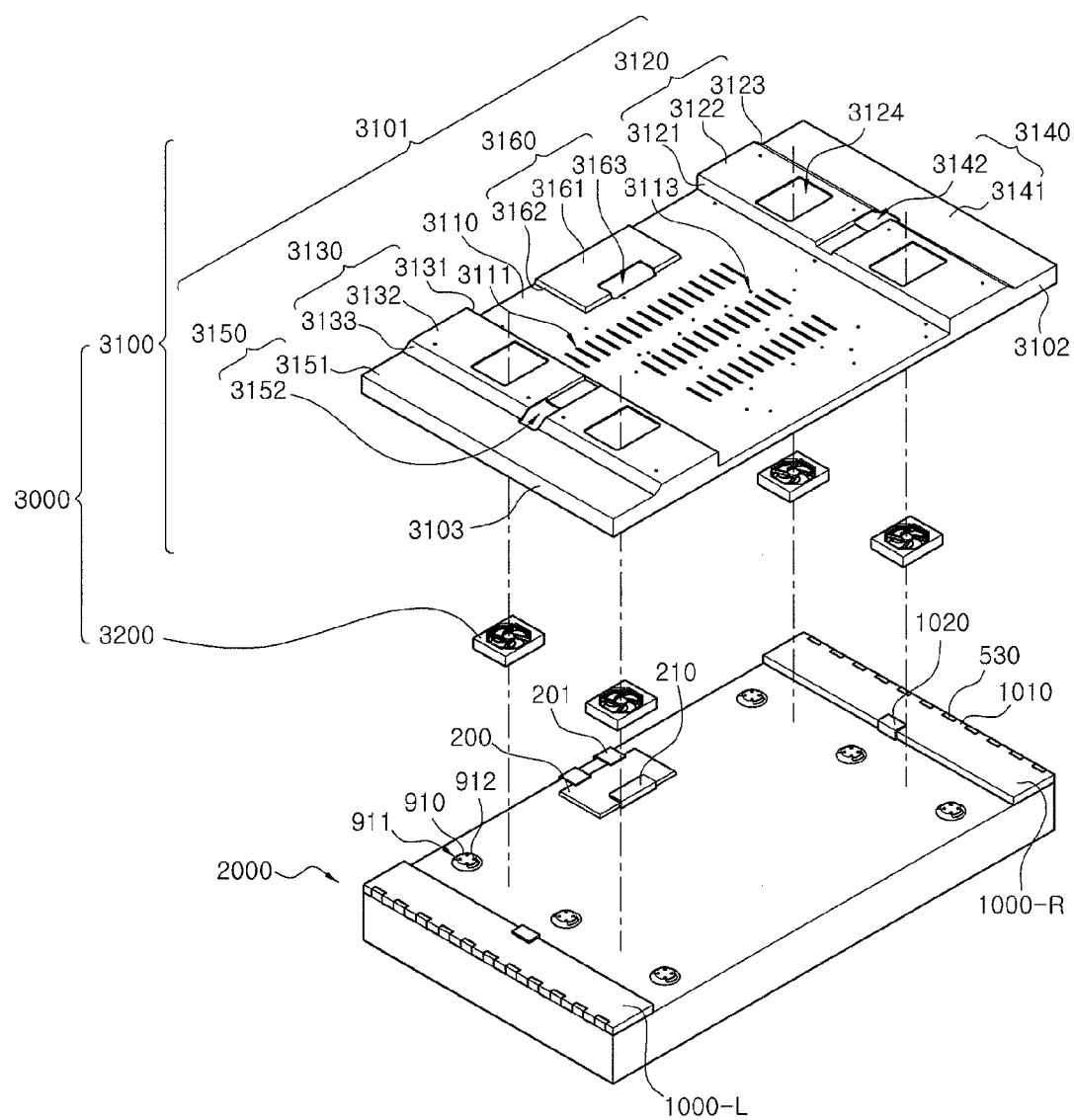
FIG. 3 is an exploded perspective view showing a display module and a heat radiation cover portion according to an exemplary embodiment of the present invention.
Figure 4:
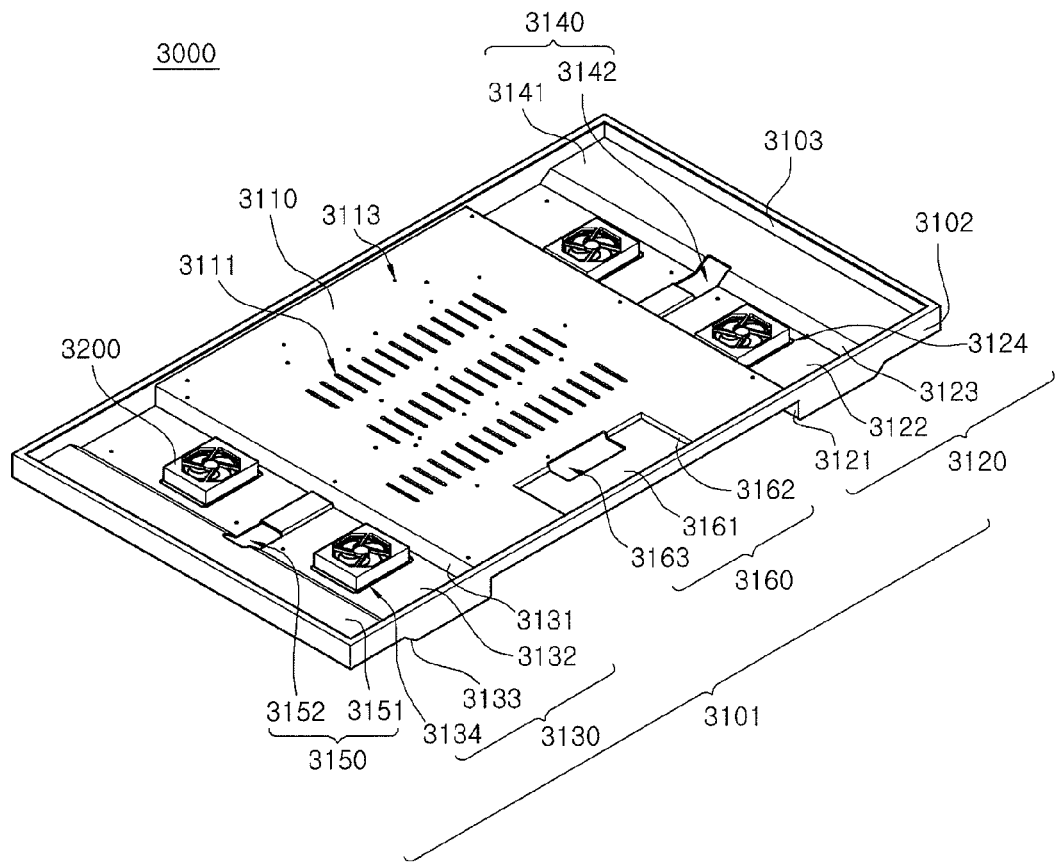
FIG. 4 is a perspective view illustrating a heat radiation cover portion according to an exemplary embodiment of the present invention.
Figure 5:
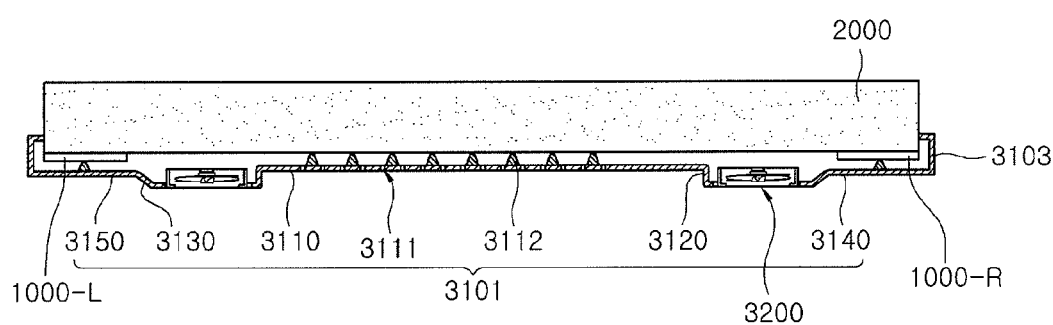
FIG. 5 is a sectional view illustrating a display apparatus according to an exemplary embodiment of the present invention.
Figure 6:
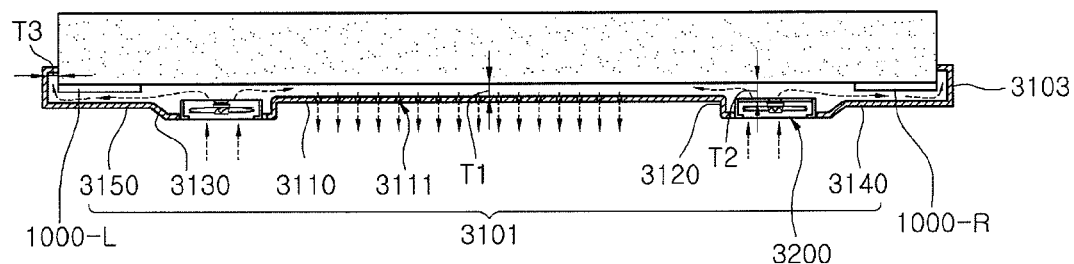
FIGS. 6 and 7 are sectional views illustrating an air flow generated by cooling fans of a heat radiation cover portion according to an exemplary embodiment of the present invention.
Figure 7:
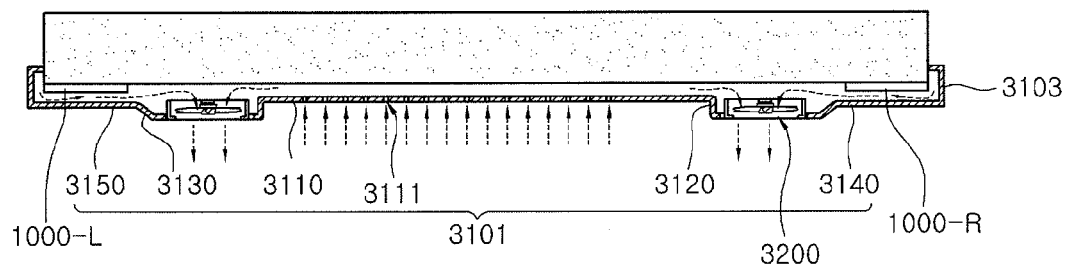
Figure 8:
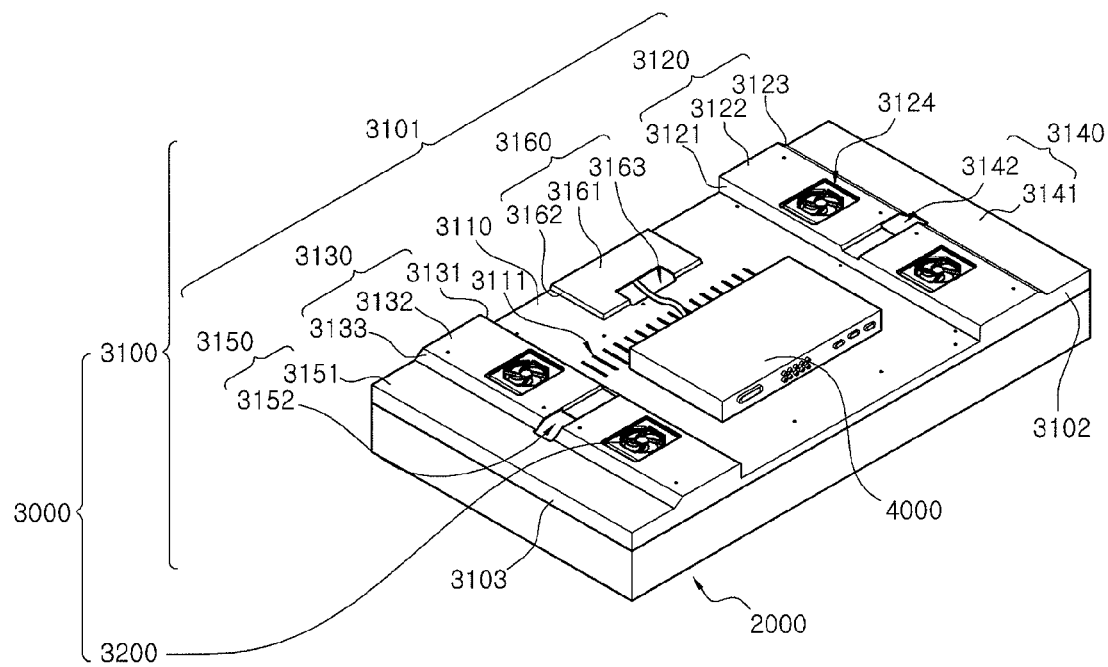
FIG. 8 is a rear perspective view illustrating a display apparatus having a display module and a heat radiation cover portion coupled to each other according to an exemplary embodiment of the present invention.

FIG. 3 is an exploded perspective view showing a display module and a heat radiation cover portion according to an exemplary embodiment of the present invention. FIG. 4 is a perspective view illustrating a heat radiation cover portion according to an exemplary embodiment of the present invention. FIG. 5 is a sectional view illustrating a display apparatus according to an exemplary embodiment of the present invention. FIGS. 6 and 7 are sectional views illustrating an air flow generated by cooling fans of a heat radiation cover portion according to an exemplary embodiment of the present invention. FIG. 8 is a rear perspective view illustrating a display apparatus having a display module and a heat radiation cover portion coupled to each other according to an exemplary embodiment of the present invention.

Referring to FIGS. 1 to 8, a display apparatus includes a display module 2000 and a heat radiation cover portion 3000. The display module 2000 includes a display assembly 10 and a backlight assembly 20. The display assembly 10 includes a liquid crystal display panel 100, a control board 200, a panel support member 300 and an upper receiving member 400. The liquid crystal display panel 100 includes an upper substrate 110 with color filters and a common electrode formed thereon, and a lower substrate 120 with thin film transistors (TFTs) and pixel electrodes formed thereon. A liquid crystal layer is interposed between the upper substrate 110 and the lower substrate 120.

A light shielding pattern, and R, G and B color filters which emit certain colors when light passes therethrough are formed on the upper substrate 110. A common electrode comprising a transparent conductor such as indium tin oxide (ITO) or indium zinc oxide (IZO) is positioned on the shielding pattern and the color filters. In an exemplary embodiment, the shielding pattern and the color filters may be formed on the lower substrate 120.

The lower substrate 120 includes the plurality of pixel electrodes arranged in a matrix form, and the TFTs respectively connected to the plurality of pixel electrodes. Data lines are connected to source terminals of the TFTs, and gate lines are connected to gate terminals thereof.

When a turn-on voltage is applied to the gate line, the TFT connected to the gate line is turned on. When an image signal is applied through the data line, the image signal of the data line is charged in the pixel electrodes through the turned-on TFT. Therefore, an electric field is generated between the pixel electrode of the lower substrate 120 and the common electrode of the upper substrate 110. Accordingly, the arrangement of liquid crystal molecules of the liquid crystal layer is changed due to the electric field. The light transmittance is changed according to the change of the liquid crystal molecules arrangement, to thereby acquire a desired image.

Referring to FIG. 2, polarization sheets 130 are attached to a top surface of the upper substrate 110 and a bottom surface of the lower substrate 120.

The control board 200 supplies various signals for displaying an image to the liquid crystal display panel 100. In FIG. 1, the control board 200 is connected to the lower substrate 120 through flexible printed circuit boards 201. In an exemplary embodiment, a separate driving circuit board (not shown) may be provided on the lower substrate 120 and connected to the control board 200 through a flexible printed circuit board. The driving circuit board and the lower substrate 120 may be electrically connected through the flexible printed circuit board. A voltage generator for generating an internal voltage, a gray voltage generator for generating a gray voltage, a data driver for providing an image signal to the data line, and a gate driver for supplying a turn-on voltage to the gate line may be formed on the driving circuit board. In an exemplary embodiment, a controller for controlling the aforementioned elements may be provided. The control part including the voltage generator, the gray voltage generator, the data driver and the gate driver may also be provided in the control board 200.

The control board 200 may be provided with a signal converter for converting an image signal transmitted from an external system to be suitable for the liquid crystal display panel. The control board 200 may be provided with a storage unit for storing user's set values. Some elements of the control part may be mounted on the flexible printed circuit board. Some elements of the control part may be mounted on one side of the liquid crystal display panel 100. The gate driver which is one element of the control part may be integrated in one side region of the liquid crystal display panel 100.

The control board 200 is fixed to a rear surface of the display module 2000. That is, as shown in FIGS. 2 and 3, the control board 200 is fixed to an outside bottom surface of a lower receiving member 900. The control board 200 includes an input connector 210 having input pins. Referring to FIG. 3, the control board 200 can be connected to the liquid crystal display panel 100 through a plurality of flexible printed circuit boards 201.

The panel support member 300 supports the liquid crystal display panel 100. The panel support member 300 is formed in a shape of, for example, a hollow quadrangular frame. Referring to FIG. 1, the panel support member 300 includes a hollow frame body portion 310, and a protruding portion 320 protruding from a lower portion of an inner wall of the frame body portion 310 to a hollow space thereof. The protruding portion 320 supports the liquid crystal display panel 100. That is, the liquid crystal display panel 100 is seated on the protruding portion 320. An upper portion of the inner wall of the frame body portion 310 on which the protruding portion 320 is not formed (i.e., an upper portion of the inner wall above the protruding portion 320) causes the liquid crystal display panel 100 to be fixed. That is, the inner walls of the frame body portion 310 surround the side surfaces of the liquid crystal display panel 100 to prevent the liquid crystal display panel 100 from moving in the ordinate and abscissa directions. In an exemplary embodiment, the frame body portion 310 and the protruding portion 320 are manufactured in a single body. The panel support member 300 may be manufactured by, for example, a press process or a molding process. The panel support member 300 may comprise resin such as, for example, plastic.

The upper receiving member 400 accommodates the liquid crystal display panel 100, the panel support member 300 and the backlight assembly 20. In an exemplary embodiment, the upper receiving member 400 is fixedly coupled to the backlight assembly 20. The upper receiving member 400 includes a plane portion 410 formed in the shape of a hollow quadrangular frame, and a sidewall portion 420 extending from an edge of the plane portion 410. The liquid crystal display panel 100, the panel support member 300 and the backlight assembly 20 are accommodated in the inner space of the plane portion 410 and the sidewall portion 420. Accordingly, this configuration prevents the elements from escaping and protects the elements from an external impact. The upper receiving member 400 may comprise a metal of high strength, light weight and low deformation characteristics.

The backlight assembly 20 includes a lamp unit 500 for generating light, lamp fixing frames 550 for fixing the lamp unit 500, a heat blocking plate 600 and an optical film portion 700 disposed over the lamp unit 500, and a reflection sheet 800 for reflecting light of the lamp unit 500. The backlight assembly 20 may further include the lower receiving member 900 for accommodating the lamp unit 500, the reflection sheet 800, the lamp fixing frames 550, the heat blocking plate 600 and the optical film portion 700. In an exemplary embodiment, a thermal diffusion plate 950 is interposed between the lower receiving member 900 and the lamp unit 500. The backlight assembly 20 includes a lamp power supply unit 1000 (1000-R and 1000-L) for supplying power to the lamp unit 500.

Referring to FIG. 2, the lamp unit 500 includes a plurality of lamps 510, and lamp holders 520 for respectively supporting the plurality of lamps 510. The lamp unit 500 includes lamp connectors 530 electrically connected to both terminals of the lamps 510. The lamp connectors 530 are exposed to the outside through a bottom of the lower receiving member 900. Accordingly, through holes (not shown) through which the lamp connectors 530 pass are formed in both side edge regions of the bottom of the lower receiving member 900.

For example, CCFLs are used as the lamps 510. External electrode fluorescent lamps (EEFL) may also be employed as the lamps 510. In an exemplary embodiment, the lamp unit 500 may be provided with at least one base plate and a plurality of LEDs mounted on the base plate. In FIG. 1, the lamps 510 are arranged in a major axis direction of the display module 2000. In an exemplary embodiment, the lamps 510 may be arranged in a minor axis direction of the display module 2000.

The lamp fixing frames 550 fix the lamp unit 500 to the lower receiving member 900. The lamp fixing frame 550 has fixing grooves 551 for fixing the lamp unit 500. Referring to FIG. 1, the lamp fixing frame 550 includes an upper wall, an outer wall and an inner wall. The outer wall extends perpendicularly to the bottom of the lower receiving member 900. The inner wall inclines with respect to the bottom of the lower receiving member 900. As the inner wall has a predetermined inclination, light emitted toward the inner wall can be led to the optical film portion 700. Referring to FIG. 2, the heat blocking plate 600 is supported on the upper walls of the lamp fixing frames 550. In an exemplary embodiment, the heat blocking plate 600 may be fixed to central regions of the inner walls since the inner walls are inclined. For example, protrusions may be formed on the inner walls so that the heat blocking plate 600 is positioned thereon. The outer wall contacts sidewalls of the lower receiving member 900.

The fixing grooves 551 are formed in the inner wall. Referring to FIG. 1, the fixing grooves 551 are formed so that some portions of a lower region of the inner wall are recessed in an upward direction. The lamp holders 520 of the lamp unit 500 are fitted into the plurality of fixing grooves 551, whereby the lamp unit 500 is fixed thereto. In FIG. 1, the bar-shaped lamp fixing frames 550 are provided at both ends of the lamps 510. That is, the lamp fixing frames 550 are positioned in two short side regions of the lower receiving member 900. The lamp fixing frame 550 may be formed in a shape of, for example, a quadrangular frame, and thus, the edge region of the optical film portion 700 positioned on the lamp unit 500 can be seated on the lamp fixing frames 550. The lamp fixing frame 550 may also be formed as a plurality of blocks.

The reflection sheet 800 is provided in a region below the lamp unit 500. The reflection sheet 800 may be provided in a side region of the lamp unit 500. Accordingly, the reflection sheet 800 can upwardly reflect light emitted in directions (for example, downward and lateral directions) other than an upward direction (i.e., a direction toward the optical film portion 700) among the light emitted by the lamp unit 500.

The thermal diffusion plate 950 is positioned under the lamp unit 500. Referring to FIGS. 1 and 2, the thermal diffusion plate 950 is positioned under the reflection sheet 800. The thermal diffusion plate 950 diffuses heat of the lamp unit 500 and thus prevents thermal concentration. The thermal diffusion plate 950 may comprise a material of high thermal conductivity to rapidly absorb heat of the lamp unit 500 and rapidly radiate the absorbed heat to the outside.

The heat blocking plate 600 is positioned over the lamp unit 500. The heat blocking plate 600 prevents heat of the lamp unit 500 from being transferred to the optical film portion 700 and the display assembly 10 (i.e., the liquid crystal display panel 100). This configuration can prevent the optical film portion 700 and the display assembly 10 from being damaged due to heat of the lamp unit 500.

The optical film portion 700 is positioned over the heat blocking plate 600. The optical film portion 700 is provided with a luminance improving sheet 710 and one or more diffusion sheets 720. The luminance improving sheet 710 transmits light traveling in a direction parallel to the transmission axis of the light, and reflects light traveling in the other directions. The diffusion sheet 720 diffuses light incident from the lamp unit 500 to be uniformly distributed in a wide range. In an exemplary embodiment, the optical film portion 700 may further include a diffusion plate performing the same function as the diffusion sheet 720. In an exemplary embodiment, the optical film portion 700 may further include various optical sheets or optical plates for changing characteristics of light.

The lower receiving member 900 has an accommodation space defined therein. The lower receiving member 900 is formed, for example, in the shape of a box with an open top face. The lower receiving member 900 accommodates the thermal diffusion plate 950, the reflection sheet 800, the lamp unit 500, the lamp fixing frames 550, the heat blocking plate 600 and the optical film portion 700 in the accommodation space. This configuration prevents the elements from escaping and protects the elements from an external impact.

Referring to FIG. 3, a plurality of concave portions 910 may be formed in a bottom surface of the lower receiving member 900. The concave portions 910 are protruded from the inside bottom surface to the outside bottom surface of the lower receiving member 900. In an exemplary embodiment, at least one vent 911 is formed in a sidewall surface of the concave portion 910. Fixing holes 912 are formed in a bottom of the concave portion 910. The concave portions 910 are protruded from the inside to the outside. The fixing holes 912 are formed in the bottom of the concave portions 910. The heat radiation cover portion 3000 is fixed thereto by fixing members such as, for example, screws, whereby elements in the lower receiving member can be protected from being damaged. Cool air introduced into a space between the heat radiation cover portion 3000 and the bottom surface of the display module 2000 is introduced into the lower receiving member 900 through the vents 911, thereby cooling the lamps 510.

The lamp power supply unit 1000 supplies power to the lamp unit 500. The lamp power supply unit 1000 includes first and second power supply units 1000-R and 1000-L. The first and second power supply units 1000-R and 1000-L include power converters (not shown) for converting external power and supplying the converted power to the lamp unit 500. In an exemplary embodiment, the power converter boosts a voltage of the external power. That is, the power converter includes at least one transformer. In an exemplary embodiment, the power converter can convert a state of the external power, i.e., DC into AC or AC into DC.

In an exemplary embodiment, the two power supply units 1000-R and 1000-L are provided to shorten a light emission time of the lamps 510 and reduce the amount of power supplied by each power supply unit. That is, the display module 2000 according to an exemplary embodiment has a large size (for example, over about 40 inches), so that the size of the lamp 510 also increases. When a voltage is applied only to one end of the lamp 510, it takes a longer time for the lamps 510 to emit light than when the voltage is applied to both ends of the lamp 510. This is because it takes a predetermined time for electric discharge caused by the voltage applied to one end of the lamp 510 to reach the other end. However, when a voltage is applied to both ends of the lamp 510 as illustrated in an exemplary embodiment of the present invention, the light emission time of the lamp 510 is shortened.

To cause the lamps 510 such as CCFLs to emit light, a large voltage is required at an initial stage (i.e., an initial time point of applying power). However, according to an exemplary embodiment, since the first and second power supply units 1000-R and 1000-L are provided at both the ends of the lamps 510, the voltage applied to the lamps 510 at the initial stage can be reduced into about a half. For example, when one power supply unit is used, the power supply unit supplies total power for causing the lamps to emit light. When two power supply units are used, each of the two power supply units supplies half of the total power to the lamps, thereby causing the lamps to emit light.

Referring to FIGS. 2 and 3, the first and second power supply units 1000-R and 1000-L are fixed to the outside bottom surface of the lower receiving member 900 (i.e., the rear surface of the display module 2000). The first and second power supply units 1000-R and 1000-L are respectively fixed to both opposite edge regions of the outside bottom surface. The first and second power supply units 1000-R and 1000-L can be fixed to the rear surface of the display module 2000 using fixing members. For example, screws, adhesive or hooks may be used as the fixing member. In an exemplary embodiment, the lower receiving member 900 is provided with the hooks, and the first and second power supply units 1000-R and 1000-L are provided with fixing grooves into which the hooks are fixed, or vice versa.

The first and second power supply units 1000-R and 1000-L may include output connectors 1010 connected to the lamp connectors 530 of the lamp unit 500. Referring to FIGS. 2 and 3, the lamp connector 530 is formed in a protrusion shape, and the output connector 1010 is formed in a concave shape so that the protrusion-shaped lamp connector 530 can be fitted into the concave-shaped output connector 1010. Accordingly, the lamp connectors 530 protruding to the outside bottom surface of the lower receiving member 900 through the lower receiving member 900 are electrically connected to the output connectors 1010 of the first and second power supply units 1000-R and 1000-L. The first and second power supply units 1000-R and 1000-L may include input connectors 1020 for receiving external power.

Referring to FIG. 1, the lower receiving member 900 accommodates therein the thermal diffusion plate 950, the reflection sheet 800, the lamp unit 500, the lamp fixing frames 550, the heat blocking plate 600 and the optical film portion 700. The panel supporting portion 300 is positioned on the lower receiving member 900. Therefore, the lower side optical film portion 700 can be fixed. Then, the liquid crystal display panel 100 is positioned on the panel support member 300. The control board 200 can be fixed, for example, to the outside bottom surface of the lower receiving member 900. Thereafter, the edge regions of the liquid crystal display panel 100, the panel support member 300 and the lower receiving member 900 are covered with the upper receiving member 400. The lamp power supply unit 1000 is fixed to the outside bottom surface of the lower receiving member 900, thereby manufacturing the display module 2000. In exemplary embodiments of the present invention, a manufacturing method may be changed in various ways. In an exemplary embodiment, the liquid crystal display panel 100 is exposed on the front surface of the display module 2000, and the outside bottom surface of the lower receiving member 900 is exposed on the rear surface thereof. An image is displayed on the front surface of the display module 2000.

In an exemplary embodiment, the heat radiation cover portion 3000 surrounds the rear surface of the display module 2000 and a portion of the sidewall surfaces thereof.

The heat radiation cover portion 3000 includes a heat radiation cover 3100, and a plurality of cooling fans 3200 mounted to the heat radiation cover 3100. Referring to FIGS. 6 and 7, the heat radiation cover 3100 is spaced apart from the rear and sidewall surfaces of the display module 2000 by a predetermined distance. This is because the space between the heat radiation cover 3100 and the display module 2000 can function as an air passage through which the air flow caused by the cooling fans 3200 flows. Accordingly, the air flow is generated in the outside surface region of the rear and sidewall surfaces of the display module 2000, thereby cooling the rear and sidewall surfaces of the display module 200. For example, an average spaced distance T1 between the rear and sidewall surfaces of the display module 2000 and the heat radiation cover 3100 ranges from about 3 mm to about 12 mm. The display module 2000 and the heat radiation cover 3100 can be spaced apart from each other by the average spaced distance T1. In an exemplary embodiment, a spaced distance T2 or T3 can be larger or smaller than the spaced distance T1 by about 1 mm to about 15 mm (referring to T2 and T3 of FIGS. 6 and 7). The heat radiation cover 3100 and the display module 2000 may be in contact with each other or spaced apart from each other by a maximum distance of about 27 mm depending on location. If the spaced distance is shorter than 3 mm, the air flow is not smooth in such a space, which degrades the cooling efficiency. If the spaced distance is longer than 12 mm, the air flow is weak in the space, which also degrades the cooling efficiency. In an exemplary embodiment, the spaced distance ranges from about 5 mm to about 9 mm. Although T2, T3 and T1 are different in FIGS. 6 and 7, in an exemplary embodiment, at least two of T1, T2 and T3 can be the same.

The heat radiation cover 3100 can be formed in a quadrangular box shape with an open top face. The heat radiation cover 3100 can cover the whole rear surface of the display module 2000. Referring to FIG. 2, the heat radiation cover 3100 covers a portion of the sidewall surfaces of the display module 2000. The heat radiation cover 3100 may comprise a synthetic resin including, for example, plastic. The heat radiation cover 3100 may comprise a metal.

As the heat radiation cover 3100 formed as a single body covers the lower region of the display module 2000, the control board 200 and the lamp power supply unit 1000, which are attached to the rear surface of the display module 2000, can be protected. Therefore, a manufacturing process of the display apparatus can be simplified. In a conventional art, a first cover for protecting the control board 200 attached to the rear surface of the display module 2000 and second and third covers for protecting the lamp power supply unit 1000 are used. In a conventional art, when the plurality of cooling fans 3200 are used, covers as many as the cooling fans 3200 are necessary for protecting the cooling fans 3200. Accordingly the plurality of covers are attached to the rear surface of the display module 2000, thereby complicating the process and increasing the process time. However, according to an exemplary embodiment, such covers are incorporated into the single heat radiation cover 3100. Therefore, all of the control board 200, the lamp power supply unit 1000 and the plurality of cooling fans 3200 can be covered with the single heat radiation cover 3100. As a result, the manufacturing process of the display apparatus can be simplified and the process time thereof can also be shortened.

Referring to FIGS. 3 and 4, the heat radiation cover 3100 includes a bottom surface 3101, two long side wall surfaces 3102, and two short side wall surfaces 3103. In an exemplary embodiment, the bottom surface 3101 is formed in a rectangular shape. The bottom surface 3101 of the heat radiation cover 3100 can be bent, curved, protruded or indented according to a surface state of the rear surface of the display module 2000. The long side wall surfaces 3102 vertically extend from the long sides of the rectangular-shaped bottom surface 3101. The short side wall surfaces 3103 vertically extend from the short sides of the bottom surface 3101.

Referring to FIG. 3, the control board 200 and the first and second power supply units 1000-R and 1000-L of the lamp power supply unit 1000 protrude from the lower surface of the display module 2000. Accordingly, the bottom surface 3101 of the heat radiation cover 3100 includes a central portion 3110, first and second fan mounting portions 3120 and 3130 on which the plurality of cooling fans 3200 are mounted, first and second power cover portions 3140 and 3150 corresponding to the first and second power supply units 1000-R and 1000-L, and a control cover portion 3160 corresponding to the control board 200.

The bottom surface of the heat radiation cover 3100 has the central portion 3110. The central portion 3110 is formed in a plate shape. A spaced distance between the central portion 3110 and the rear surface of the display module 2000 may range from about 3 mm to about 12 mm. Referring to FIG. 5, a plurality of protruding portions 3112 for maintaining the spaced distance may be formed on the central portion 3110. The protruding portions 3112 are formed on an inside surface of the central portion 3110 to extend toward the rear surface of the display module 2000. The protruding portions 3112 contact the rear surface of the display module 2000. Accordingly, the protruding portions 3112 prevent the central portion 3110 from being bent due to external force or self weight and thus not being spaced apart from the display module 2000. The protruding portions 3112 may be formed by attaching separate members to the inside surface of the central portion 3110. The protruding portions 3112 may be manufactured by causing some portions of the central portion 3110 to protrude from the outside to the inside. The number of the protruding portions 3112 may vary. In an exemplary embodiment, the protruding portions 3112 may be formed on the rear surface of the display module 2000. That is, the protruding portions 3112 may be formed on the outside bottom surface of the lower receiving member 900.

A plurality of center holes 3111 for allowing air to flow in and out are provided in the central portion 3110. Referring to FIG. 6, when the cool air is blown into the space through the cooling fans 3200, the air is discharged through the center holes 3111. Referring to FIG. 7, when the air in the space is discharged to the outside through the cooling fans 3200, the cool air is introduced through the center holes 3111. In an exemplary embodiment, the cool air is blown into the space through the cooling fans 3200. Referring to FIGS. 2 and 3, the central portion 3110 of the bottom surface of the heat radiation cover 3100 corresponds to the central region of the rear surface of the display module 2000. Temperature of the central portion 3110 of the bottom surface is lower than that of the other regions. Therefore, the plurality of center holes 3111 are formed in the central portion 3110.

A plurality of user holes 3113 are formed in the central portion 3110. The user holes 3113 are used when a user of the display apparatus attaches a separate external device thereto. That is, as shown in FIG. 8, an A/D board 4000, which is an external device, can be fixed to the display apparatus through the user holes 3113. Referring to FIGS. 3 and 4, the user holes 3113 can be positioned in the region in which the plurality of center holes 3111 are formed. When the external device is attached to the region of the center hole 3111, the air discharged through the center holes 3111 can also cool the external device.

The first and second fan mounting portions 3120 and 3130 are respectively formed in both opposite edge regions of the central portion 3110. The first and second fan mounting portions 3120 and 3130 are manufactured in a concave shape with regard to an imaginary extension surface of the inside surface of the central portion 3110. That is, as shown in FIGS. 1 and 4, the first and second fan mounting portions 3120 and 3130 are formed in a concave shape to be pressed from the inside to the outside.

Each of the first and second fan mounting portions 3120 and 3130 includes an inner wall 3121 or 3131 extending from each edge of the central portion 3110 from the inside to the outside of the central portion 3110, a first extension bottom 3122 or 3132 extending from the inner wall 3121 or 3131 to be parallel to the inside surface of the central portion 3110, and an outer wall 3123 or 3133 extending from the second extension bottom 3122 or 3132 from the outside to the inside of the central portion 3110. Accordingly, as shown in FIGS. 2 and 4, the first extension bottoms 3122 and 3132 are positioned below the inside plane surface of the central portion 3110. In an exemplary embodiment, a plurality of fan fixing holes 3124 and 3134 are formed in the first extension bottoms 3122 and 3132. The cooling fans 3200 are fixed to regions of the fan fixing holes 3124 and 3134. Blade regions of the cooling fans 3200 are exposed through the fan fixing holes 3124 and 3134. Screws may be used to fix the cooling fans 3200. In an exemplary embodiment, a variety of fixing members such as hooks, adhesive, or bolts and nuts may be employed. In an exemplary embodiment, two fan fixing holes 3124 or 3134 are formed in the first or second fan mounting portion 3120 or 3130. In an exemplary embodiment, more or less fan fixing holes 3124 and 3134 may be formed according to the number of the cooling fans 3200. In an exemplary embodiment, more or less than two fan mounting portions may be formed. The cooling fans 3200 may be installed on the outside surfaces thereof.

The cool air supplied by the cooling fans 3200 is initially introduced into the regions of the first and second fan mounting portions 3120 and 3130. Therefore, as shown in FIG. 6, the spaced distance T2 between the first and second fan mounting portions 3120 and 3130 and the display module 2000 may be larger than that of the spaced distance in the other regions. The spaced distance T2 may be adjusted according to the cooling capability and the number of the cooling fans 3200.

The cooling fans 3200 can be supplied with power from the first and second power supply units 1000-R and 1000-L of the display module 2000. The first and second power supply units 1000-R and 1000-L can supply uniform power. The first and second power supply units 1000-R and 1000-L cause the lamps 510 of the display module 2000 to emit light. Accordingly, the lamps 510 can emit light and the cooling fans 3200 can be driven simultaneously. The power supplied from the first and second power supply units 1000-R and 1000-L to the cooling fans 3200 may be varied according to a control signal of the control board 200. The control signal of the control board 200 supplied to the first and second power supply units 1000-R and 1000-L is varied depending on temperature of the display module 2000. Therefore, the operation of the cooling fans 3200 can be controlled according to the temperature of the display module 2000. That is, a rotational speed of the cooling fans 3200 is increased if the temperature of the display module 2000 rises, and the rotational speed of the cooling fans 3200 is decreased or the cooling fans 3200 may be stopped if the temperature of the display module 2000 falls.

A portion of power lines for connecting the first and second power supply units 1000-R and 1000-L to the cooling fans 3200 are positioned, for example, in an inside bottom surface region of the lower receiving member 900. That is, one ends of the power lines are electrically connected to the first and second power supply units 1000-R and 1000-L. The other ends thereof pass through the through holes formed in the lower receiving member 900 and are electrically connected to the cooling fans 3200 positioned over the through holes. Most portions of the power lines adhere to the inside bottom surface of the lower receiving member 900 through an adhesion member. An air passage is defined between the outside bottom surface of the lower receiving member 900 (i.e., the rear surface of the display module 2000) and the heat radiation cover portion 3000. Accordingly, the power lines are placed so that they do not hinder air from flowing in the air passage.

In an exemplary embodiment, the cooling fans 3200 may operate by the power supplied from the analog to digital (A/D) board 4000 attached to the heat radiation cover portion 3000. The power lines are positioned on an outside surface of the heat radiation cover portion 3000 (a surface opposite to a surface facing the display module 2000). One end of the power lines may pass through the heat radiation cover portion 3000 and may be electrically connected to the cooling fans 3200. The driving of the cooling fans 3200 may be controlled by a temperature sensor of the A/D board 4000.

The first power cover portion 3140 is formed in an edge region of the first fan mounting portion 3120, and the second power cover portion 3150 is formed in an edge region of the second fan mounting portion 3120. The first and second power cover portions 3140 and 3150 cover the first and second power supply units 1000-R and 1000-L positioned on the rear surface of the display module 2000, thereby protecting the first and second power supply units 1000-R and 1000-L from an external impact. The first and second power cover portions 3140 and 3150 keep a spaced interval between the first and second power supply units 1000-R and 1000-L and the heat radiation cover 3100 to be constant, thereby cooling the lamp power supply unit 1000. That is, as shown in FIGS. 6 and 7, the cool air supplied through the cooling fans 3200 is supplied to the outside surface of the lamp power supply unit 1000, thereby cooling the lamp power supply unit 1000.

Each of the first and second power cover portions 3140 and 3150 includes a second extension bottom 3141 or 3151 extending from the outer wall 3123 or 3133 of the first or second fan mounting portion 3120 or 3130 to be parallel to the inside surface of the central portion 3110, and a first terminal opening 3142 or 3152 formed in a portion of the second extension bottom 3141 or 3151.

The second extension bottoms 3141 and 3151 have shapes and sizes corresponding to those of the first and second power supply units 1000-R and 1000-L, respectively. A spaced distance between the second extension bottom 3141 or 3151 and an exposed surface of the first or second power supply unit 1000-R or 1000-L is constant in the aforementioned range such as, for example, about 3 mm to about 12 mm. Referring to FIG. 5, the protruding portions 3112 for keeping the spaced distance to be constant can be formed in a space between the second extension bottoms 3141 and 3151 and the first and second power supply units 1000-R and 1000-L.

Referring to FIGS. 2 and 4, the second extension bottoms 3141 and 3151 are positioned below the inside plane surface of the central portion 3110 and above the first extension bottoms 3122 and 3132. This is because an additional element is not positioned on the rear surface of the display module 2000 corresponding to the central portion 3110, but the first and second power supply units 1000-R and 1000-L are positioned on the rear surface of the display module 2000 corresponding to the second extension bottoms 3141 and 3151. Accordingly, the second extension bottoms 3141 and 3151 are positioned, for example, below the central portion 3110 by the thickness of the first and second power supply units 1000-R and 1000-L. The cooling fans 3200 are mounted on the first and second fan mounting portions 3120 and 3130 including the first extension bottoms 3122 and 3132. Therefore, the first extension bottoms 3122 and 3132 are positioned, for example, below the second extension bottoms 3141 and 3151 due to the thickness of the cooling fans 3200. If the thickness of the cooling fans 3200 is small, the first extension bottoms 3122 and 3123 and the second extension bottoms 3141 and 3151 can be positioned at the same level.

The first terminal openings 3142 and 3152 are provided in correspondence to the input connectors 1020 of the first and second power supply units 1000-R and 1000-L positioned on the rear surface of the display module 2000. That is, the input connectors 1020 are exposed through the first terminal openings 3142 and 3152. Accordingly, the input connectors 1020 can be connected to connectors (not shown) for supplying external power. The first terminal openings 3142 and 3152 may be formed in a shape extending from the second extension bottoms 3141 and 3151 toward the outer walls 3123 and 3133 of the first and second fan mounting portions 3120 and 3130. The first terminal openings 3142 and 3152 may partially extend to portions of the second extension bottoms 3122 and 3132 of the first and second fan mounting portions 3120 and 3130.

The control cover portion 3160 is formed in one side of the central portion 3110. That is, the control cover portion 3160 is positioned in a region of the central portion 3110 corresponding to the control board 200. The control cover portion 3160 includes a third extension bottom 3161, connection wall surfaces 3162 and a second terminal opening 3163.

The third extension bottom 3161 corresponds in shape and size to the control board 200. A spaced distance between the third extension bottom 3161 and an exposed surface of the control board 200 is constant in the range of about 3 mm to about 12 mm. The connection wall surfaces 3162 connect the central portion 3110 to the third extension bottom 3161. In an exemplary embodiment, the connection wall surfaces 3162 protect the exposed side surface region of the control board 200. The second terminal opening 3163 is formed in the third extension bottom 3161 to expose the input connector 210 of the control board 200. The second terminal opening 3163 may be formed to extend to the connection wall surfaces 3162. In an exemplary embodiment, the second terminal opening 3163 may be formed to extend to a portion of the central portion 3110. Referring to FIG. 8, the input connector 210 exposed through the second terminal opening 3163 is connected to the A/D board 4000. Accordingly, the control board 200 receives external image signals and a plurality of control signals.

The short side wall surfaces 3103 of the heat radiation cover 3100 extend from the second extension bottoms 3141 and 3151. Referring to FIG. 2, the short side wall surfaces 3103 extend to portions of the sidewall surface region of the display module 2000. End regions of the short side wall surfaces 3103 are connected to the display module 2000. That is, the end regions of the short side wall surfaces 3103 protrude to be fixedly connected to the display module 2000. The long side wall surfaces 3102 also extend to portions of the sidewall surface region of the display module 200.

The heat radiation cover portion 3000 including the heat radiation cover 3100 and the cooling fans 3200 attached to the heat radiation cover 3100 is fixedly mounted to the display module 2000 through a fixing member (not shown). Screws or bolts and nuts may be used as the fixing member. Alternatively, an adhesive material of predetermined thickness may be used as the fixing member. In an exemplary embodiment, hooks may be used to fix the heat radiation cover portion 3000 to the display module 2000. If the screws are employed, fixing holes may be formed in the heat radiation cover portion 3000 and the display module 2000. If the bolts and nuts are used, the nuts may be attached to the display module 2000, and fixing holes may be formed in the heat radiation cover portion 3000 so that the bolts can be inserted into the fixing holes. If the adhesive material is used, the thickness of the adhesive material is identical to the spaced distance between the heat radiation cover portion 3000 and the display module 2000. If the hooks are used, the hooks may be formed on or attached to the heat radiation cover portion 3000, and hook fixing grooves to which the hooks can be caught may be formed in the display module 2000, or vice versa. That is, the hooks may be formed on or attached to the display module 2000, and the hook fixing grooves may be formed in the heat radiation cover portion 3000. In an exemplary embodiment, the heat radiation cover portion 3000 can be fixed to the rear and/or sidewall surfaces of the display module 2000 through the fixing member.

In an exemplary embodiment, the heat radiation cover portion 3000 may be fixedly mounted to the sidewall surface region of the display module 2000. Concave portions may be formed in the sidewall surfaces of the display module 2000, and protrusions fitted into the concave portions can be provided on the wall surfaces of the heat radiation cover 3100 of the heat radiation cover portion 3000. Hook-shaped protrusions may be formed on the wall surfaces of the heat radiation cover 3100. The sidewall surfaces of the display module 2000 can be the side surfaces of the lower receiving member or the upper receiving member. Alternatively, the concave portions may be formed in the wall surfaces of the heat radiation cover 3100, and the protrusions fitted into the concave portions may be provided on the sidewall surfaces of the display module 2000.

The heat radiation cover portion 3000 and the display module 2000 can be coupled to each other using either the aforementioned fixing member or the concave portions and protrusions.

The cooling operation of the display apparatus having the heat radiation cover portion 3000 is explained below.

The display apparatus of an exemplary embodiment cools the rear surface region of the display module 2000 using an air-cooling method.

Referring to FIG. 6, external air is continuously introduced into the space between the cooling fans 3200 and the display module 2000 by the cooling fans 3200 mounted to the heat radiation cover portion 3000. The introduced external air spreads to peripheral regions of the cooling fans 3200. That is, the air flow is generated to cool the rear surface region of the display module 2000.

The temperature of the display module 2000 can be lowered by cooling the backlight assembly region generating a large amount of heat among the elements of the display module 2000 by the external cool air introduced by the cooling fans. That is, the lamps 510 are cooled by cooling the rear surface of the display module 2000, i.e., the outside bottom surface of the lower receiving member 900. The lamp power supply unit 1000 generating a most amount of heat in the backlight assembly 20 can be cooled directly by the external cool air. Accordingly, the display module 2000 can be prevented from being damaged due to the heat of the backlight assembly 20.

Referring to FIG. 7, the air of the space between the heat radiation cover portion 3000 and the display module 2000 can be discharged to the outside of the heat radiation cover portion 3000 by the cooling fans 3200 mounted to the heat radiation cover portion 3000. Therefore, the air flow is generated in the space to cool the display module 2000.

Figure 9:
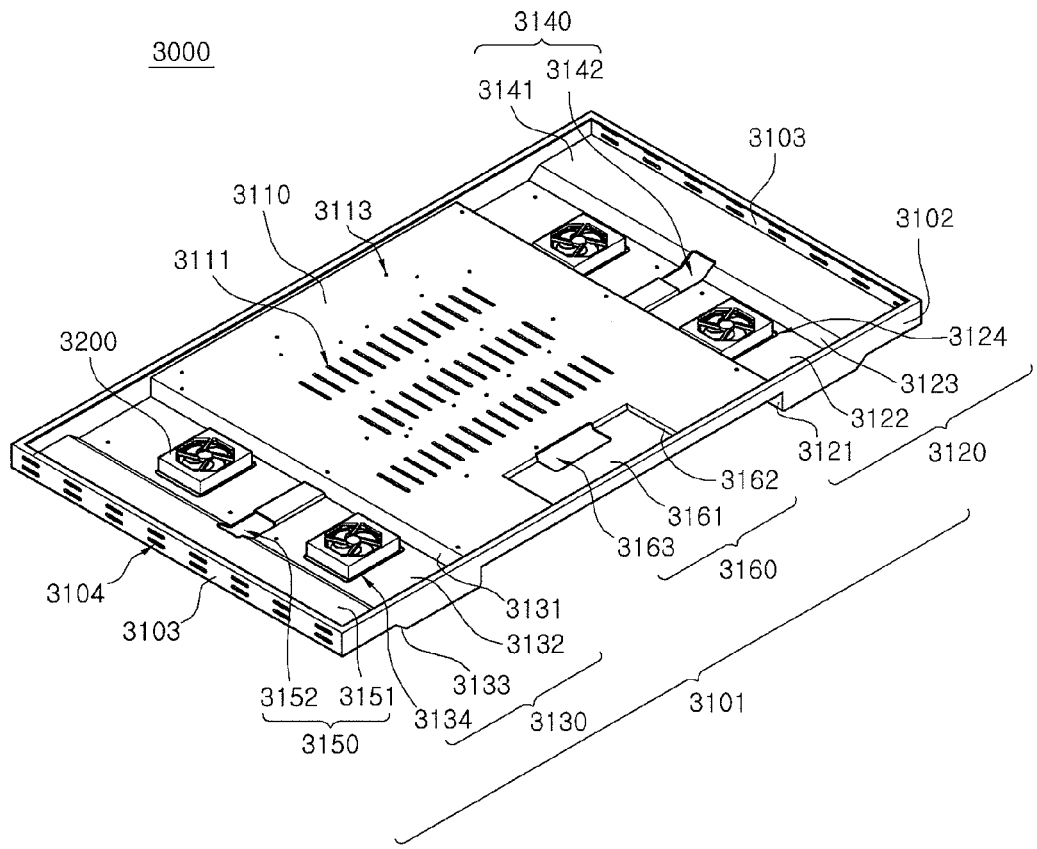
FIG. 9 is a perspective view illustrating a heat radiation cover portion according to an exemplary embodiment of the present invention.
Figure 10:
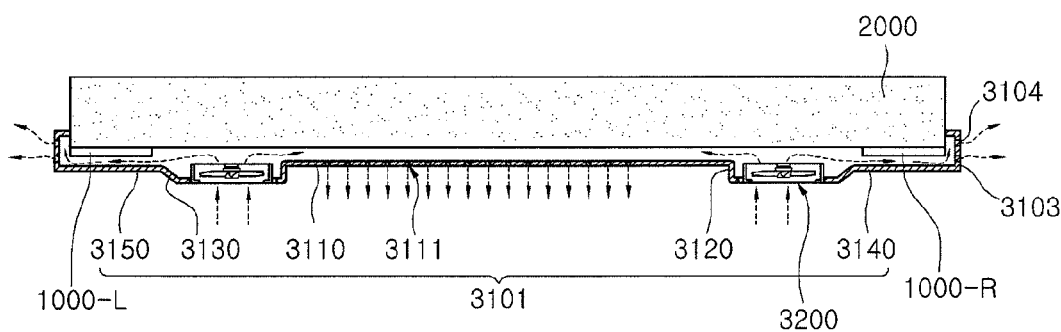
FIG. 10 is a sectional view illustrating a display apparatus having a heat radiation cover portion according to an exemplary embodiment of the present invention.
Figure 11:
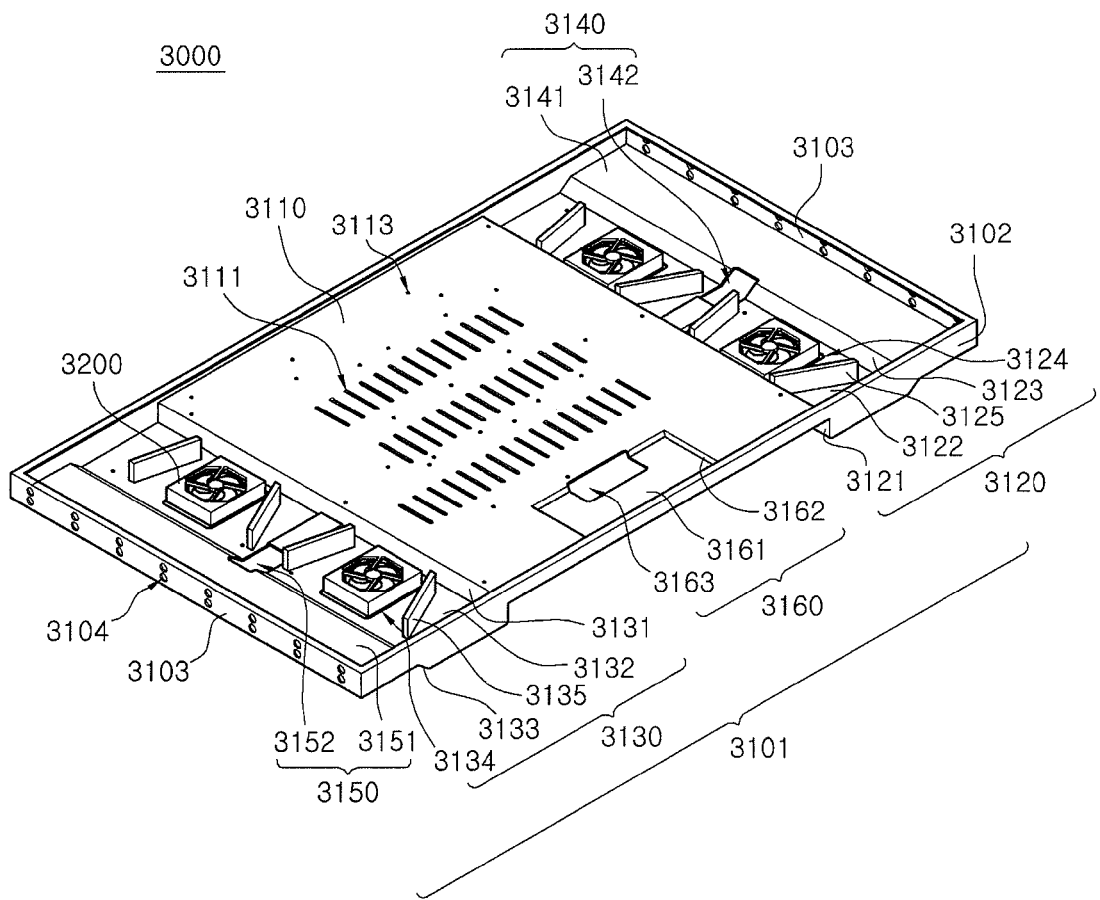
FIG. 11 is a perspective view illustrating a heat radiation cover portion according to an exemplary embodiment of the present invention.
Figure 12:
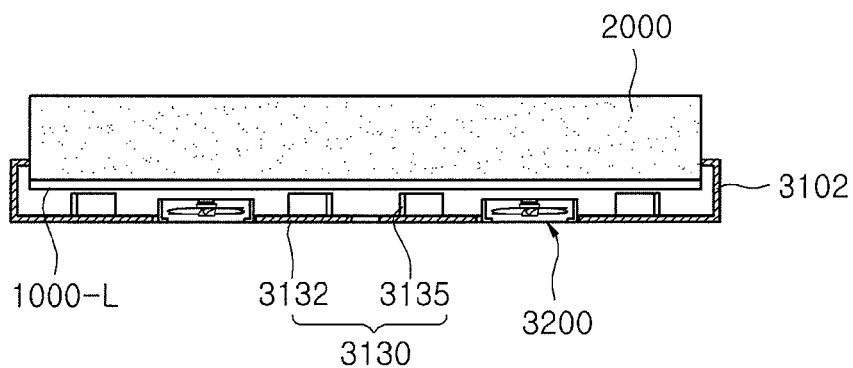
FIG. 12 is a sectional view illustrating a display apparatus having a heat radiation cover portion according to an exemplary embodiment of the present invention.
Figure 13:
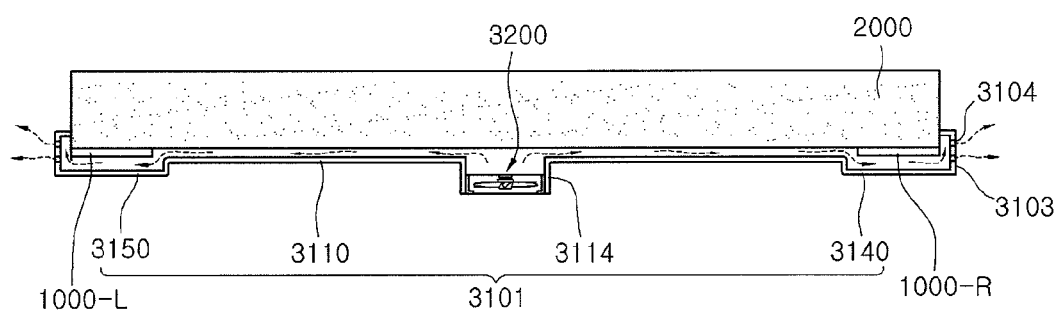
FIG. 13 is a sectional view illustrating a display apparatus according to an exemplary embodiment of the present invention.
Figure 14:
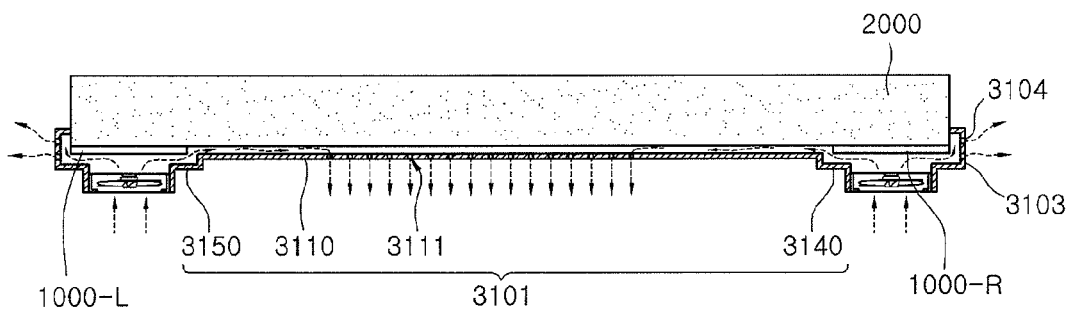
FIG. 14 is a sectional view illustrating a display apparatus according to an exemplary embodiment of the present invention.

FIG. 9 is a perspective view illustrating a heat radiation cover portion according to an exemplary embodiment of the present invention. FIG. 10 is a sectional view illustrating a display apparatus having a heat radiation cover portion according to an exemplary embodiment of the present invention. FIG. 11 is a perspective view illustrating a heat radiation cover portion according to an exemplary embodiment of the present invention. FIG. 12 is a sectional view illustrating a display apparatus having a heat radiation cover portion according to an exemplary embodiment of the present invention. FIG. 13 is a sectional view illustrating a display apparatus according to an exemplary embodiment of the present invention. FIG. 14 is a sectional view illustrating a display apparatus according to an exemplary embodiment of the present invention.

Referring to FIGS. 9 and 10, a plurality of heat radiation holes 3104 may be formed in short side wall surfaces 3103 of a heat radiation cover portion 3000. That is, as shown in FIG. 10, the external air supplied from cooling fans 3200 cools a lamp power supply unit 1000, and then, the air is discharged to the outside through the heat radiation holes 3104. Accordingly, the cooling efficiency of a cooling a display module 2000 can be improved. The heat radiation holes 3104 may also be formed in long side wall surfaces 3102.

Referring to FIGS. 11 and 12, air guide plates 3125 and 3135 for leading the external air supplied from cooling fans 3200 to a target direction may be provided in regions adjacent to the cooling fans 3200. The air guide plates 3125 and 3135 are attached to first extension bottoms 3122 and 3132 of first and second fan mounting portions 3120 and 3130. As shown in FIG. 12, the air guide plates 3125 and 3135 extend respectively from the first extension bottoms 3122 and 3132 toward a display module 2000. The air guide plates 3125 and 3135 are respectively positioned in regions adjacent to fan fixing holes 3124 and 3134. The air guide plates block the external air supplied by the cooling fans 3200 from spreading toward long side wall surfaces, and cause the external air to flow toward a lamp power supply unit 1000. The air guide plates 3125 and 3135 are spaced apart from the display module 2000. Accordingly, the air flow can be partially blocked from spreading toward the long side wall surfaces. The air guide plates 3125 and 3135 may be in close contact with the display module 2000. In an exemplary embodiment, the air guide plates 3125 and 3135 may function as protruding portions 3112.

Referring to FIG. 13, cooling fans 3200 of a heat radiation cover portion 3000 may be formed on a central portion 3110 of a heat radiation cover 3100. Accordingly, first and second fan mounting portions 3120 and 3130 to which the plurality of cooling fans 3200 are mounted can be omitted. First and second power cover portions 3140 and 3150 extending from the central portion 3110 can be positioned at both opposite edges of the central portion 3110. A plurality of fan fixing portions 3114, fixing the cooling fans 3200, may be provided in the central portion 3110. Each of the fan fixing portions 3114 includes a through hole which is bored through the central portion 3110, and a fixing wall extending through the through hole. The cooling fans 3200 are fixed using the fixing walls. In an exemplary embodiment, each of the fan fixing portions 3114 may include a through hole which is bored through the central portion 3110, and a fixing member for fixing the central portion 3110 around the through hole and the cooling fan 3200. Screws or bolts and nuts can be used as the fixing member. The cooling fans 3200 may be fixed to regions of the central portion 3110 over the through holes using, for example, 'L'-shaped fixing members.

Referring to FIG. 14, cooling fans 3200 of a heat radiation cover portion 3000 may be formed on first and second power cover portions 3140 and 3150. Accordingly, the external air supplied from the cooling fans 3200 is directly ejected to a lamp power supply unit 1000, thereby improving the cooling efficiency of the lamp power supply unit 1000. As first and second fan mounting portions 3120 and 3130 are omitted, a manufacturing process of the heat radiation cover portion 3000 can be simplified. Because a spaced interval between the heat radiation cover portion 3000 and a display module 2000 is maintained to be uniform, the uniform cooling can be performed.

Figure 15:
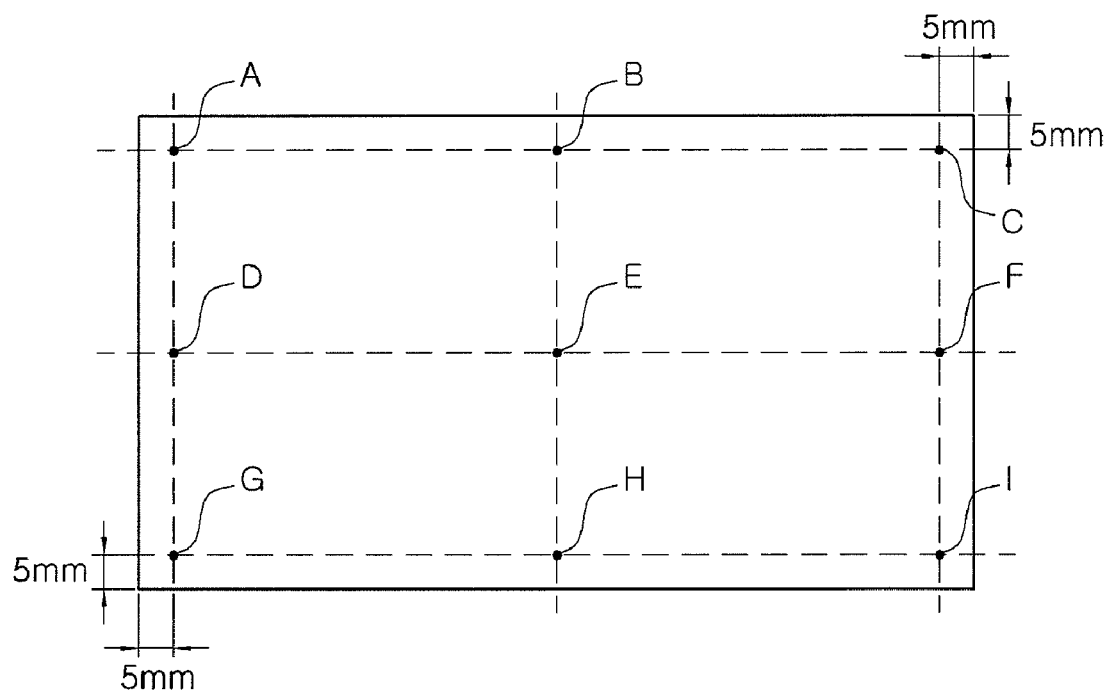
FIG. 15 illustrates temperature measurement points of a display apparatus according to an exemplary embodiment of the present invention.

FIG. 15 illustrates temperature measurement points of a display apparatus according to an exemplary embodiment of the present invention.

Table 1 shows temperatures of displays apparatuses according to exemplary embodiments and a comparative example, which are measured at nine temperature measurement points of FIG. 15.

The display apparatus of the comparative example includes cooling fans without a heat radiation cover portion.

TABLE 1

|  | A | B | C | D | E | F | G | H | I |
|---|---|---|---|---|---|---|---|---|---|
| Comparative example | 35.2 | 36.4 | 33.4 | 42.1 | 32.6 | 32.7 | 31.3 | 33.1 | 32.8 |
| Present embodiment | 31.1 | 35.5 | 32.4 | 40.7 | 31.1 | 30.9 | 31.2 | 32.7 | 30.3 |

As shown in Table 1, the temperatures of the display apparatus of the present embodiment are lower than those of the display apparatus of the comparative example. For example, at a point A, the temperature of the display apparatus of the present embodiment is lower than that of the display apparatus of the comparative example by 4.1° C.

According to exemplary embodiments of the present invention, the display module 2000 is used in the liquid crystal display panel 100 for displaying an image. However, the display module 2000 can be applied to, for example, a plasma display panel (PDP) or an active matrix organic light emitting diode (AM-OLED).

According to exemplary embodiments of the present invention, a heat radiation cover for covering a whole rear surface of a display module is attached to protect elements positioned on the rear surface of the display module, and a manufacturing process of the display apparatus can be simplified.

According to exemplary embodiments of the present invention, a space is defined between the display module and the heat radiation cover, and the air flow is generated in the space by cooling fans, thereby cooling the display module. As a result, the reliability of the display apparatus can be improved.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A display apparatus, comprising:
   a display module displaying an image using power and a control signal, the display module having a first surface including at least one power supply unit for supplying the power and a control board for supplying the control signal; and
   a heat radiation cover portion covering a part of the first surface of the display module including the power supply unit and the control board,
   wherein the heat radiation cover portion forms an air passage between the first surface of the display module and the heat radiation cover portion,
   wherein the heat radiation cover portion comprises a heat radiation cover spaced apart from the first surface of the display module and forming the air passage, and at least one cooling fan mounted to the heat radiation cover for controlling air flow in the air passage, and
   wherein a bottom surface of the heat radiation cover comprises at least one fan mounting portion manufactured in a concave shape.

2. The display apparatus as claimed in claim 1, wherein the air passage is defined throughout the first surface of the display module and the distance between the heat radiation cover and the first surface is about 3 mm to about 12 mm.

3. The display apparatus as claimed in claim 1, wherein the heat radiation cover portion further comprises a plurality of protruding portions formed between the heat radiation cover and the first surface of the display module.

4. The display apparatus as claimed in claim 1, wherein a plurality of holes communicating with the air passage are formed in the heat radiation cover.

5. The display apparatus as claimed in claim 1, wherein the cooling fan is electrically connected to the power supply unit of the display module through a power line, a portion of the power line extends to an inside of the display module, and an end of the power line extends to an inside of the air passage and is connected to the cooling fan.

6. The display apparatus as claimed in claim 1, wherein the bottom surface covers the first surface of the display module, and the heat radiation cover comprises a wall surface covering at least a portion of a sidewall surface of the display module, wherein the bottom surface and the wall surface are formed as a single body.

7. The display apparatus as claimed in claim 6, wherein the bottom surface of the heat radiation cover further comprises:
   a central portion corresponding to a central region of the first surface of the display module;
   at least one power cover portion corresponding to the at least power supply unit mounted to the first surface of the display module; and
   a control cover portion corresponding to the control board mounted to the first surface of the display module,
   wherein the central portion, the power cover portion and the control cover portion are formed as a single body.

8. The display apparatus as claimed in claim 7, wherein the at least one fan mounting portion is formed in a region adjacent to the power cover portion, wherein the at least one fan mounting portion is mounted with the at least one cooling fan.

9. The display apparatus as claimed in claim 8, wherein the central portion is manufactured in a plate shape, the fan mounting portion comprises first and second fan mounting portions extending from both sides of the central portion, and the power cover portion comprises first and second plate-shape power cover portions respectively extending from the first and second fan mounting portions.

10. The display apparatus as claimed in claim 9, wherein inside bottoms of the first and second power cover portions are positioned below an inside bottom of the central portion, and inside bottoms of the first and second fan mounting portions are positioned below the inside bottoms of the first and second power cover portions.

11. The display apparatus as claimed in claim 8, wherein the fan mounting portion comprises at least one fan fixing hole corresponding to the cooling fan.

12. The display apparatus as claimed in claim 11, wherein the fan mounting portion comprises an air guide plate provided in a region adjacent to the fan fixing hole.

13. The display apparatus as claimed in claim 7, wherein the cooling fan is mounted to the central portion, or the power cover portion, or to the central portion and the power cover portion.

14. The display apparatus as claimed in claim 7, wherein the power supply unit comprises a power input connector, wherein the control board comprises a signal input connector, and the bottom surface of the heat radiation cover further comprises a first terminal opening exposing the power input connector and a second terminal opening exposing the signal input connector.

15. The display apparatus as claimed in claim 7, wherein a plurality of center holes are formed in the central portion, and a user hole for fixing an analog to digital (ND) board is formed in a region in which the center holes are formed.

16. The display apparatus as claimed in claim 15, wherein the cooling fan is electrically connected to the A/D board through a power line.

17. The display apparatus as claimed in claim 15, wherein the power supply unit comprises a power input connector, wherein the control board comprises a signal input connector, and the bottom surface of the heat radiation cover further comprises a first terminal opening exposing the power input connector and a second terminal opening exposing the signal input connector, the A/D board electrically connected to the control board through the signal input connector in the second terminal opening.

18. The display apparatus as claimed in claim 1, wherein the heat radiation cover is fixed to the first or a second surface of the display module through a fixing member, wherein the first and second surfaces are rear and sidewall surfaces of the display module.

19. The display apparatus as claimed in claim 1, wherein the display module comprises:
   a liquid crystal display panel;
   a backlight supplying light to the liquid crystal display panel; and
   a receiving member accommodating the liquid crystal display panel and the backlight.

20. A heat radiation cover portion for cooling a display module comprising:
   a side surface surrounding the display module; and
   a bottom surface substantially perpendicular to the side surface, the bottom surface including:
   a central portion including a plurality of holes receiving air therethrough;
   a fan mounting portion for receiving cooling fans to generate air flow therethrough; and
   a protruding portion for maintaining a distance between the display module and the bottom surface of the heat radiation cover,
   wherein the fan mounting portion is manufactured in a concave shape.

* * * * *